(12) United States Patent
Honda

(10) Patent No.: US 7,064,597 B2
(45) Date of Patent: Jun. 20, 2006

(54) COMPLEMENTARY SIGNAL GENERATOR

(75) Inventor: Takashi Honda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/779,649

(22) Filed: Feb. 18, 2004

(65) Prior Publication Data
US 2005/0017781 A1 Jan. 27, 2005

(30) Foreign Application Priority Data
Jul. 24, 2003 (JP) ............................. 2003-278802

(51) Int. Cl.
H03K 3/00 (2006.01)
(52) U.S. Cl. ..................... 327/295; 327/256
(58) Field of Classification Search ............... 327/295, 327/296, 297, 112, 256, 257, 379, 387, 391; 326/93, 82, 83, 86, 87
See application file for complete search history.

(56) References Cited

U.S. PATENT DOCUMENTS

| | | | |
|---|---|---|---|
| 4,689,577 A | | 8/1987 | Vreeken et al. |
| 5,233,237 A | * | 8/1993 | Ohannes et al. ............... 326/27 |
| 5,886,562 A | * | 3/1999 | Garrity et al. ............... 327/415 |
| 5,920,210 A | * | 7/1999 | Kaplinsky ................... 327/112 |
| 6,114,891 A | * | 9/2000 | Kim ........................... 327/172 |
| 6,225,847 B1 | * | 5/2001 | Kim ........................... 327/257 |
| 6,314,151 B1 | | 11/2001 | Fukaishi |
| 6,466,054 B1 | * | 10/2002 | Kameyama et al. .......... 326/68 |
| 6,515,532 B1 | * | 2/2003 | Jinzai ......................... 327/333 |

FOREIGN PATENT DOCUMENTS

| | | |
|---|---|---|
| JP | 60-256227 | 12/1985 |
| JP | 06-152346 | 5/1994 |
| JP | 11-112335 | 4/1999 |
| JP | 2001-188615 | 7/2001 |

* cited by examiner

Primary Examiner—Timothy P. Callahan
Assistant Examiner—An T. Luu
(74) Attorney, Agent, or Firm—Nixon Peabody LLP; Donald R. Studebaker

(57) ABSTRACT

A complementary signal generator, for outputting complementary positive-phase and antiphase signals that vary between a first logical value and a second logical value, which includes a signal forming unit for outputting a positive-phase intermediate signal being in phase with an input signal varying between the first logical value and the second logical value, and an antiphase intermediate signal antiphase to the input signal. The generator also includes a first connecting means for simultaneously transferring the second logical value of the positive-phase intermediate signal and the first logical value of the antiphase intermediate signal to a positive-phase signal output part and an antiphase signal output part in synchronism with a state change of the input signal from the first logical value to the second logical value.

6 Claims, 6 Drawing Sheets

COMPLEMENTARY SIGNAL GENERATOR

BACKGROUND OF THE INVENTION

1. Field of the Invention

The present invention relates to a complementary signal generator for outputting a positive-phase signal and an antiphase signal complementary to each other.

This application is counterpart of Japanese patent applications, Serial Number 278802/2003, filed Jul. 24, 2003, the subject matter of which is incorporated herein by reference.

2. Description of the Related Art

As this type of complementary signal generator, there is known one which outputs complementary signals formed by input and output signals of inverters to switch, by complementary signals to be outputted, a plurality of switches connected so as to switch the other end of a capacitor whose one end is connected to an inversion input terminal thereof between a non-inversion input terminal and an output terminal with a view toward canceling an offset of a voltage follower, for example (e.g., refer to Patent Document 1).

As the complementary signal generator as well, there is known one having an input terminal for inputting an input signal and first and second output terminals for respectively outputting a positive-phase signal and a negative-phase or antiphase signal, and having a configuration wherein a first logic circuit for performing a timing adjustment to the input signal is connected between the input terminal and the first output terminal, and a second logic circuit for performing an output timing adjustment to the antiphase signal is connected even between the input terminal and the second output terminal (refer to Patent Document 2, for example).

(Patent Document 1)
Japanese Laid Open Patent Application No. Hei 2001-188615 (FIG. 4 in third page)

(Patent Document 2)
Japanese Laid Open Patent Application No. Hei 6-152346 (FIG. 1 in third to fourth pages)

In the circuit using the inverters as in the Patent Document 1 referred to above, no signal is propagated as long as the input signal to each inverter does not exceed a threshold voltage thereof. Therefore, an inversion timing is shifted between the input and output signals of the inverters, which are used as the complementary signals. Further, the Patent Document 2 was also similar to the Patent Document 1 in that complementary signals shifted in inversion timing were outputted.

A problem arises in that when, for example, the offset cancel circuit is driven by the complementary signals shifted in inversion timing as mentioned above, the timing provided to charge or discharge the capacitor becomes inaccurate, so that the cancellation of the offset is not performed accurately.

An object of the present invention is to provide a complementary signal generator which outputs complementary signals aligned in at least one inversion timing of inversion timings provided two in one period, in order to solve the above-described problems.

SUMMARY OF THE INVENTION

According to one aspect of the present invention, there is provided a complementary signal generator, for outputting complementary positive-phase and antiphase signals that vary between a first logical value and a second logical value, which includes a signal forming unit for outputting a positive-phase intermediate signal being in phase with an input signal varying between the first logical value and the second logical value, and an antiphase intermediate signal antiphase to the input signal; and first connecting means for simultaneously transferring the second logical value of the positive-phase intermediate signal and the first logical value of the antiphase intermediate signal to a positive-phase signal output part and an antiphase signal output part in synchronism with a state change of the input signal from the first logical value to the second logical value.

According to another aspect of the present invention, there is provided a method for forming complementary positive-phase and antiphase signals that vary between a first logical value and a second logical value. The method includes forming a positive-phase intermediate signal being in phase with an input signal that varies between the first logical value and the second logical value, and an antiphase intermediate signal antiphase to the input signal; and simultaneously transferring logical values of the positive-phase intermediate signal and the antiphase intermediate signal to a positive-phase signal output part and an antiphase signal output part with timings synchronized with the change in the input signal.

The above and further objects and novel features of the invention will more fully appear from the following detailed description, appended claims and the accompanying drawings.

DETAILED DESCRIPTION OF THE PREFERRED EMBODIMENTS

Figure 1:
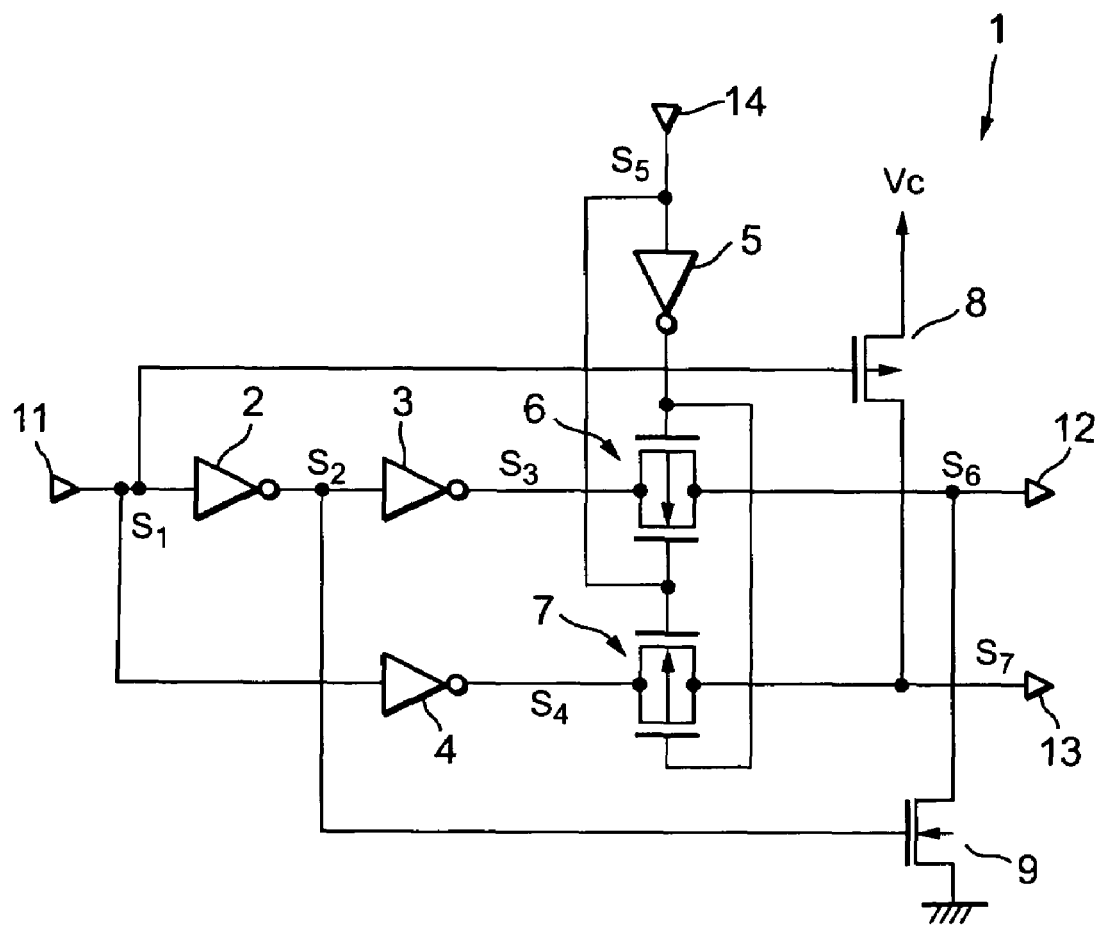
FIG. 1 is a circuit diagram showing a configuration of a complementary signal generator 1 illustrative of an embodiment 1 based on the present invention.

A complementary signal generator according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

FIG. 1 is a circuit diagram showing a configuration of a complementary signal generator according to a first preferred embodiment based on the present invention.

As shown in the same figure, an input part 11 of the complementary signal generator 1 is connected to respective input parts of inverters 2 and 4 which share impedance conversion and to the gate of a P channel type FET 8. An output part of the inverter 2 is connected to an input part of an inverter 3 and to the gate of an N channel type FET 9.

An analog switch 6 comprises a pair of FETs of a P channel type and an N channel type, which is connected in parallel. An output part of the inverter 3 is connected to one connecting terminal of the analog switch 6, and a positive-phase signal output part 12 of the complementary signal generator 1 is connected to the other connecting terminal thereof. An output part of the inverter 4 is connected to one connecting terminal of an analog switch 7 identical in configuration to the analog switch 6, and a negative-phase or antiphase signal output part 13 of the complementary signal generator 1 is connected to the other connecting terminal of the analog switch 7.

A switch signal input part 14 of the complementary signal generator 1 is connected to the gates of the N channel type FETs of the analog switches 6 and 7 and to the gates of the P channel type FETs of the analog switches 6 and 7 via an inverter 5. The source and drain of the P channel type FET 8 are respectively connected between a power supply and the antiphase signal output part 13. The drain and source of the N channel type FET 9 are respectively connected between the positive-phase signal output part 12 and ground.

Incidentally, the analog switches 6 and 7 correspond to first connecting means, and the P channel type FET 8 and N channel type FET 9 correspond to driving means.

Figure 2:
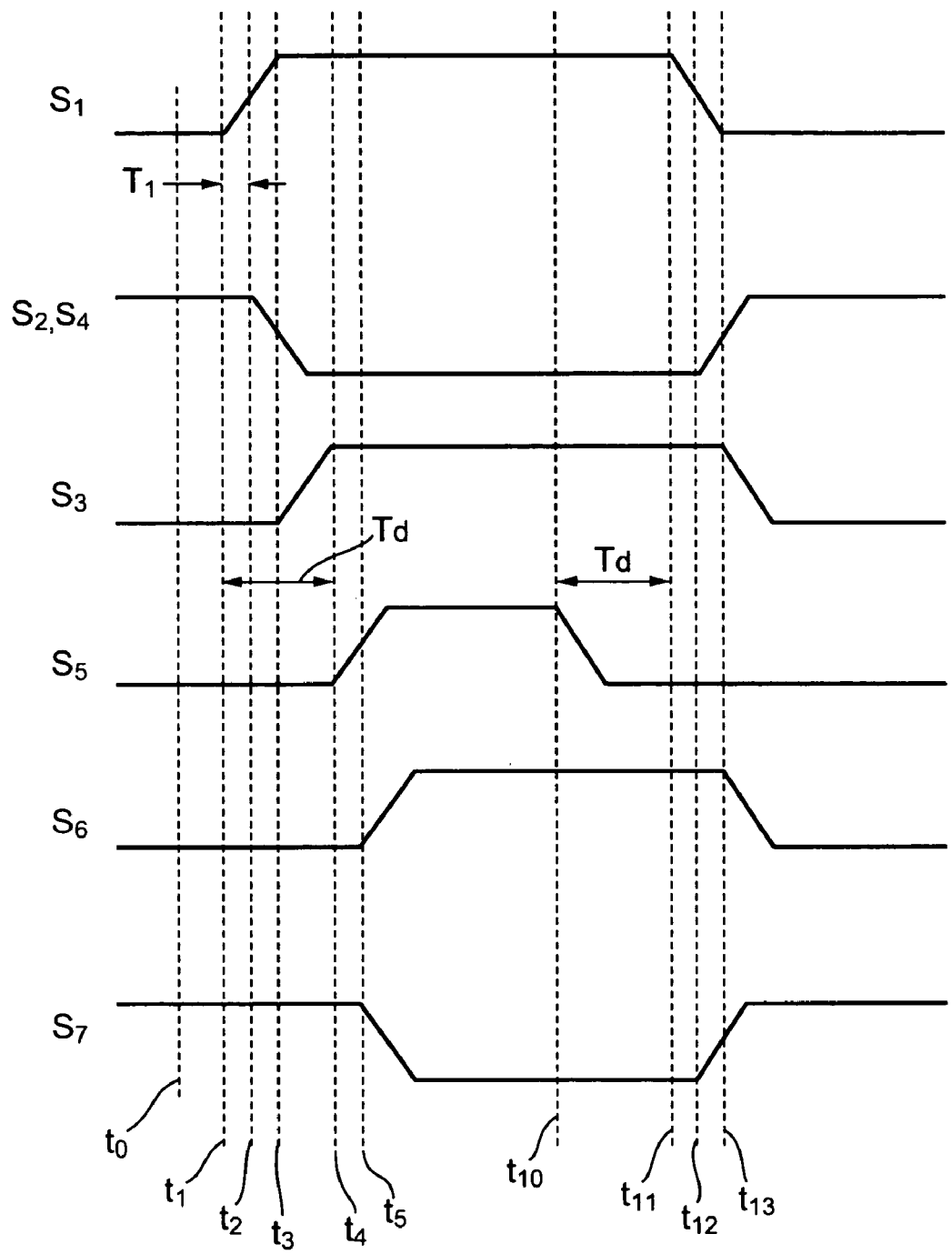
FIG. 2 is a timing chart illustrating signal waveforms at respective parts of the complementary signal generator 1.

The operation of the complementary signal generator 1 configured as described above will be explained below while referring to a timing chart of FIG. 2 showing signal waveforms at respective parts thereof.

As shown in FIG. 2, a switch signal $S_5$ inputted to the switch signal input part 14 is a signal which rises with being delayed a predetermined time Td alone with respect to an input signal $S_1$ inputted to the input part 11 and falls with being advanced the predetermined time Td alone with respect to the input signal $S_1$. The formation of these input signal $S_1$ and switch signal $S_5$ will be described later in detail. Incidentally, for simplicity of explanation, the respective elements have transition times nearly equal upon signal inversion, and the threshold voltage of the input is set to about 50% of the power supply voltage Vc for the complementary signal generator 1.

As shown in the timing chart of FIG. 2, the input signal $S_1$ and the switch signal $S_5$ are both an "L" level equivalent to a first logical value in an initial state at a time $t_0$. The analog switches 6 and 7 are in an off state for making nonconduction between the respective connecting terminals. Since the input signal $S_1$ is of the "L" level, both inverter output signals $S_2$ and $S_4$ become an "H" level equivalent to a second logical value, and an inverter output signal $S_3$ becomes an "L" level. Further, since the P channel type FET 8 and the N channel type FET 9 are both held on, a positive-phase output signal $S_6$ and a negative-phase or antiphase output signal $S_7$ are respectively placed in "L" and "H" states.

Thereafter, when the input signal $S_1$ rises at a time $t_1$, the inverter output signals $S_2$ and $S_4$ both fall at a time $t_2$ after a delay time $T_1$ has elapsed, and the inverter output signal $S_3$ rises at a time $t_3$ further delayed by the delay time $T_1$ from the time $t_2$. Since the P channel type FET 8 and N channel type FET 9 are respectively turned off at these times $t_2$ and $t_3$, the positive-phase output terminal 12 and the antiphase output terminal 13 are respectively brought to a floating state. Since, however, the analog switches 5 and 6 still remain in the off state, the positive-phase output signal $S_6$ and the antiphase output signal $S_7$ are respectively maintained in the "L" and "H" states.

At a time $t_4$ after the inverter output signal $S_3$ has reached an "H" level and the inverter output signal $S_4$ has reached an "L" level, the switch signal $S_5$ rises with being delayed the predetermined time Td alone from the input signal $S_1$. Accordingly, the N channel type FETs of the analog switches 5 and 6 are simultaneously turned on at a time $t_5$ after the delay time $T_1$ has elapsed since the time $t_4$, and subsequently the P channel type FETs thereof are further turned on. At this time, the analog switches 6 and 7 respectively become an on state which makes conduction between their connecting terminals.

Thus, the positive-phase output signal $S_6$ and the antiphase output signal $S_7$ are respectively simultaneously inverted to "H" and "L" levels with the turning on of the N channel type FETs of the analog switches 5 and 6.

Thereafter, when the switch signal $S_5$ falls at a time $t_{10}$ preceding the falling edge of the input signal $S_1$ at a time $t_{11}$, the analog switches 5 and 6 are both brought to an off state again so that the positive-phase output terminal 12 and the antiphase output terminal 13 are respectively brought to a floating state. Since, however, the P channel type FET 8 and the N channel type FET 9 still remain in the off state, the positive-phase output signal $S_6$ and the antiphase output signal $S_7$ are respectively maintained in the respective states of "H" and "L" levels.

Then when the input signal $S_1$ falls at the time $t_{11}$, the inverter output signals $S_2$ and $S_4$ rise together at a time $t_{12}$ after the delay time $T_1$ has elapsed, and the inverter output signal $S_3$ falls at a time $t_{13}$ delayed by the delay time $T_1$ from the time $t_{12}$. Since the P channel type FET 8 and the N channel type FET 9 are respectively turned on at these times $t_{12}$ and $t_{13}$, the antiphase output signal $S_7$ and the positive-phase output signal $S_6$ are respectively sequentially inverted to the levels of "H" and "L" with the turning on of the P channel type FET 8 and the N channel type FET 9.

Subsequently, the positive-phase output signal $S_6$ and the antiphase output signal $S_7$ are also repeatedly inverted in the same manner as described above with the repetition of similar signal inversion of the input signal $S_1$ and the switch signal $S_5$.

Incidentally, the parts used for outputting the output signals $S_1$, $S_2$, $S_3$ and $S_4$ correspond to a signal forming unit. The inverter output signal $S_3$ corresponds to a positive-phase intermediate signal, and the inverter output signal $S_4$ corresponds to a negative-phase or antiphase intermediate signal, respectively.

Figure 7:
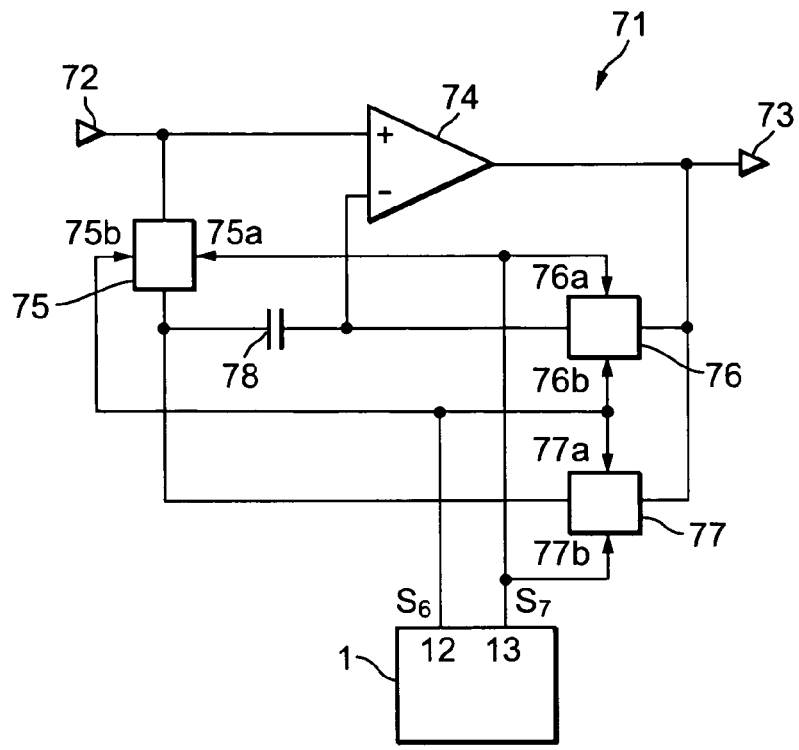
FIG. 7 is a circuit diagram illustrating a circuit configuration where complementary signals $S_6$ and $S_7$ outputted by the complementary signal generator 1 are used in a voltage circuit 71.

FIG. 7 is a circuit diagram showing a circuit configuration where the complementary signals $S_6$ and $S_7$ outputted from the complementary signal generator 1 according to the embodiment 1 referred to above are employed in a voltage circuit 71 having an emitter follower's offset cancel circuit, as an example of their utilization. The contents thereof will be explained below.

In the same drawing, the voltage circuit 71 is used in, for example, a liquid crystal display circuit, as a voltage follower for inputting, at an input part 72, a signal of predetermined bits converted into an analog signal by a D/A converter, impedance-converting it, and outputting the so-converted signal from its output part 73 as a drive signal for a liquid crystal panel. The input part 72 is connected to a non-inversion input terminal of an operational amplifier (hereinafter called "OP Amp") 74 and to one connecting terminal of an analog switch 75. An output terminal of the OP Amp 74 is connected to the output part 73 of the voltage circuit 71 and to respective one connecting terminals of analog switches 76 and 77. The other connecting terminal of the analog switch 76 is directly connected to an inversion input terminal of the OP Amp 74 and to the other input terminals of the analog switches 75 and 77 via a condenser 78.

Further, the positive-phase signal output part 12 of the complementary signal generator 1 is connected to switch signal input terminals 75b and 76b of the analog switches 75 and 76 respectively and to a switch signal input terminal 77a of the analog switch 77. Then, the antiphase signal output part 13 of the complementary signal generator 1 is connected to switch signal input terminals 75a and 76a of the analog switches 75 and 76 respectively and to a switch signal input terminal 77b of the analog switch 77.

Figure 8:
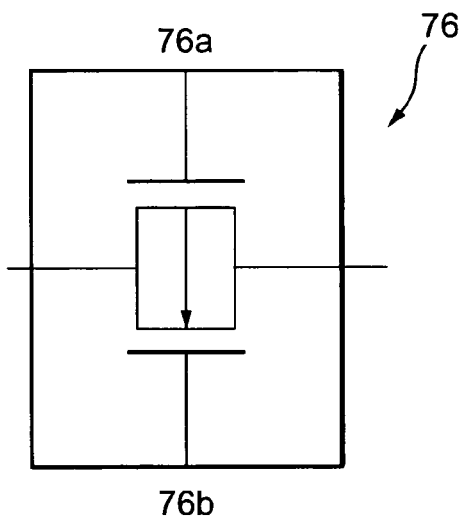
FIG. 8 is a circuit diagram showing an internal configuration of an analog switch 76 of the voltage circuit 71

Since the analog switches 75, 76 and 77 are all elements identical in configuration to one another here, an internal configuration of the analog switch 76 will be explained with the analog switch 76 as an illustrative example. FIG. 8 is a circuit diagram showing the internal configuration of the analog switch 76.

As shown in the same figure, the analog switch 76 is made up of P channel type and N channel type FETs connected in parallel. One and the other of a pair of connecting terminals are respectively connected to the sources and drains of the respective FETs. The switch signal input terminal 76a is connected to the gate of the P channel type FET, and the switch signal input terminal 76b is connected to the gate of the N channel type FET.

In the state at the time $t_{10}$ of the timing chart shown in FIG. 2 under the above configuration, i.e., during a first period in which the positive-phase output signal $S_6$ is "H" in level, and the antiphase output signal $S_7$ is taken "L", the analog switch 77 is turned off and the analog switches 75 and 76 are both turned on. During that period, an offset voltage between the input and output of the OP Amp 74 is charged into the condenser 78. On the other hand, the analog switch 77 is turned on and the analog switches 75 and 76 are both turned off in the state of the time $t_0$ of the timing chart, i.e., during a second period in which the positive-phase output signal $S_6$ is "L" in level and the antiphase output signal $S_7$ is brought to "H". Thus, an electrical charge corresponding to offset cancellation, which has been charged into the condenser 78, is piggybacked onto and fed back to the inversion input terminal of the OP Amp 74.

By interposing the condenser 78 charged with the reverse voltage corresponding to the offset between the output terminal and inversion input terminal of the OP Amp 74 as described above, the voltage circuit 71 is operated so as to cancel out the offset during the second period in which it serves as the voltage follower.

When, for example, the timing provided to cause the positive-phase output signal $S_6$ generated at the time $t_5$ of the timing chart in FIG. 2 to rise and the timing provided to cause the antiphase output signal $S_7$ to fall at the time $t_5$ are shifted from each other in the voltage circuit 71 described above, the electrical charge charged into the condenser 78 is discharged during the second period in which the voltage circuit 71 serves as the voltage follower, so that the offset is not canceled out. On the other hand, since the shift between the rise timing of the antiphase output signal $S_7$ and the fall timing of the positive-phase output signal $S_6$ at the times $t_{12}$ and $t_{13}$ falls within the first period in which the offset voltage is charged into the condenser 78, a slight error presents no problem.

According to the complementary signal generator 1 showing the embodiment 1, as described above, the inversion timings for either the rising edge of one of the outputted complementary signals and the falling edge of the other thereof or the falling edge of the one thereof and the rising edge of the other thereof can be aligned with each other. It is therefore possible to provide the complementary signals suitable for use in the switch changeover or selector signals of the offset cancel circuit for canceling out the offset of the voltage follower by using the capacitor and the switches.

Second Preferred Embodiment

A second preferred embodiment showing a complementary signal generator of the present invention will next be described below with reference to the accompanying drawings.

Figure 3:
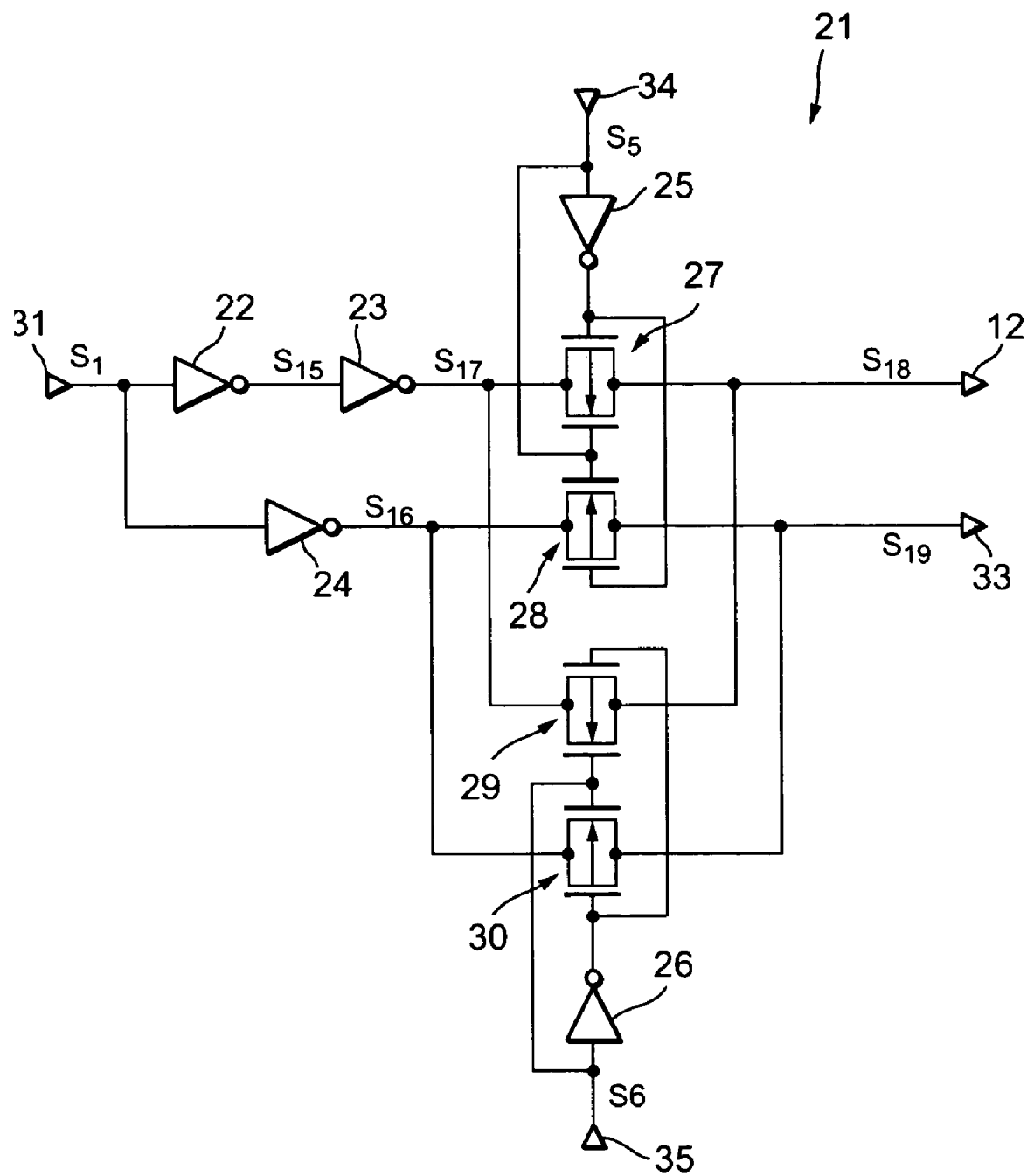
FIG. 3 is a circuit diagram depicting a configuration of a complementary signal generator 21 illustrative of an embodiment 2 based on the present invention.

FIG. 3 is a circuit diagram showing a configuration of a complementary signal generator 21 illustrative of a second preferred embodiment based on the present invention.

As shown in the same figure, an input part 31 of the complementary signal generator 21 is connected to respective input parts of inverters 22 and 24 which share impedance conversion. An output part of the inverter 22 is connected to an input part of an inverter 23. An output part of the inverter 23 is connected to respective one connecting terminals of analog switches 27 and 29 each made up of a pair of P channel and N channel type FETs connected in parallel. Similarly, an output part of the inverter 24 is connected to respective one connecting terminals of analog switches 28 and 30 each made up of a pair of P channel and N channel type FETs connected in parallel.

The other respective connecting terminals of the analog switches 27 and 29 are both connected to a positive-phase signal output part 32 of the complementary signal generator 21, and the other respective connecting terminals of the analog switches 28 and 30 are both connected to a negative-phase or antiphase signal output part 33 of the complementary signal generator 21. A first switch signal input part 34 of the complementary signal generator 21 is connected to the respective gates of the N channel type FETs of the analog switches 27 and 28 and to the respective gates of the P channel type FETs of the analog switches 27 and 28 via an inverter 25. A second switch signal input part 35 of the complementary signal generator 21 is connected to the respective gates of the N channel type FETs of the analog switches 29 and 30 and to the respective gates of the P channel type FETs of the analog switches 29 and 30 via an inverter 26. Incidentally, the analog switches 29 and 30 correspond to second connecting means.

Figure 5:
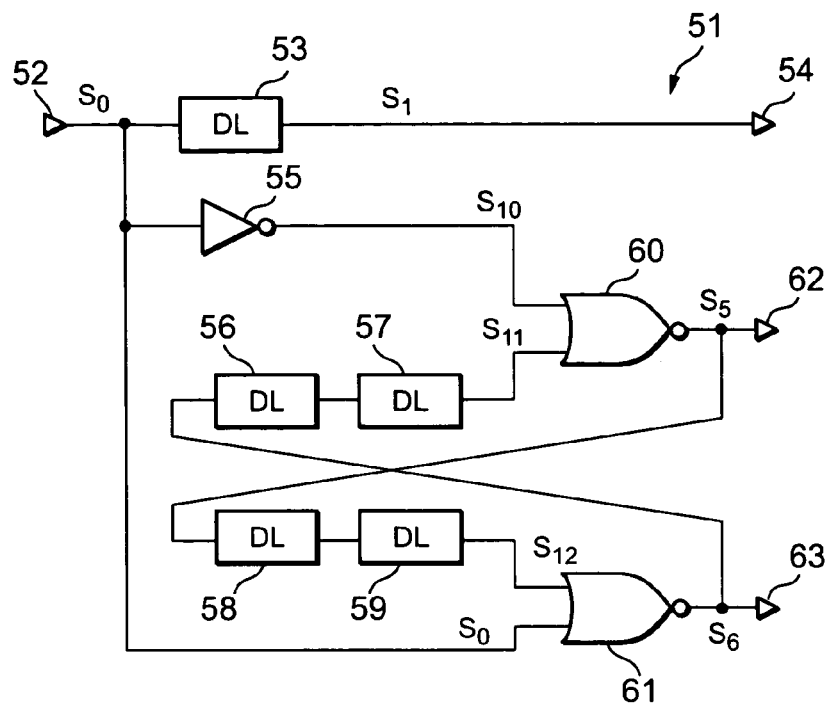
FIG. 5 is a circuit diagram of a signal generator 51 for generating an input signal $S_1$, a first switch signal $S_5$ and a second switch signal $S_6$.

Prior to the description of the operation of the complementary signal generator 21 configured as described above, an input signal $S_1$ inputted to the input part 31 of the complementary signal generator 21, a first switch signal $S_5$ inputted to the first switch signal input part 34 thereof, and a second switch signal $S_6$ inputted to the second switch signal input part 35 thereof will be explained. FIG. 5 is a circuit diagram of a signal generator 51 for generating these signals, and FIG. 6 is a signal waveform diagram showing signal waveforms at respective parts of the signal generator 51.

As shown in FIG. 5, an input part 52 of the signal generator 51 is connected to one input terminal of a NOR circuit 61. Further the input part 52 is connected to an output part 54 of the signal generator 51 via a delay circuit 53 and to one input terminal of a NOR circuit 60 via an inverter 55. An output terminal of the NOR circuit 60 is connected to an output part 62 of the signal generator 51 and to the other input terminal of the NOR circuit 61 via two delay circuits 58 and 59. An output terminal of the NOR 61 is connected to an output part 63 of the signal generator 51 and to the other input terminal of the NOR circuit 60 via two delay circuits 56 and 57. Incidentally, let's assume that the delay circuits 53, 56, 57, 58 and 59 respectively delay signals by a signal delay time Td.

Figure 6:
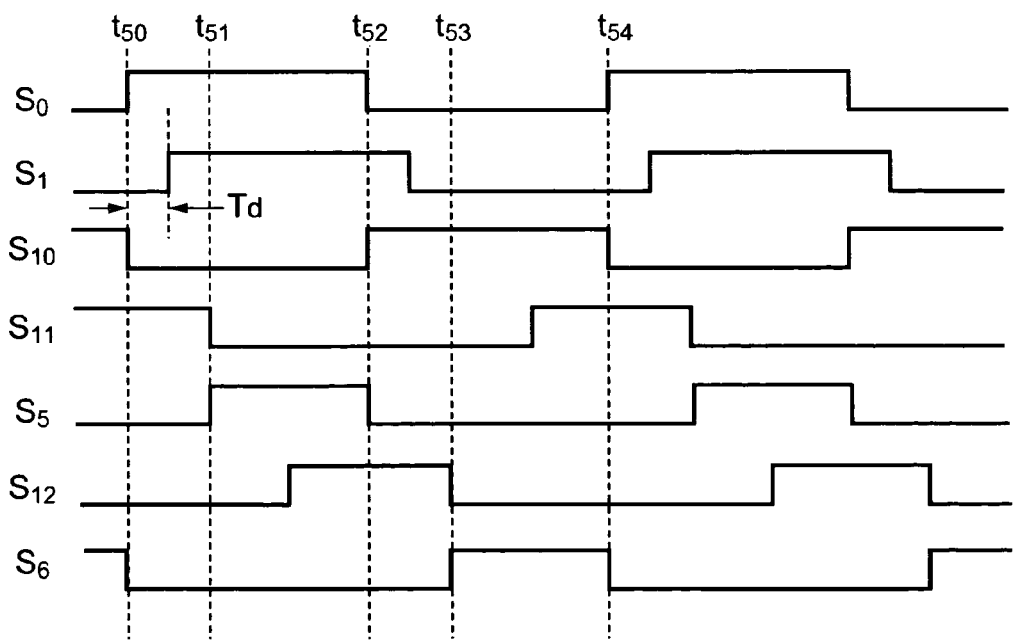
FIG. 6 is a signal waveform diagram showing signal waveforms at respective parts of the signal generator 51.

In the above-described configuration, for example, a rectangular signal $S_0$ is applied to the input part 52 as shown in the waveform diagram of FIG. 6. At this time, the input signal $S_1$ inputted to the input part 31 of the above-described complementary signal generator 21 shown in FIG. 3 is outputted from the output part 54 as a signal delayed the delay time Td alone by the delay circuit 52 with respect to the rectangular signal $S_0$.

On the rising edge of the rectangular signal $S_0$ at a time $t_{50}$, a signal $S_{10}$ obtained by inverting the signal $S_0$, and the second switch signal $S_6$ outputted from the output part 63 and inputted to the second switch input part 35 of the above-described complementary signal generator 21 shown in FIG. 3 both fall. A signal $S_{11}$ obtained by delaying the second switch signal $S_6$ falls at a time $t_{51}$ delayed by 2·Td from the time $t_{50}$, so that the first switch signal $S_5$ outputted from the output part 62 and inputted to the first switch signal input part 34 of the above-described complementary signal generator 21 shown in FIG. 3 rises.

When the rectangular signal $S_0$ falls at a time $t_{52}$, an inverted signal $S_{10}$ thereof rises and hence the first switch signal $S_5$ falls. A delayed signal $S_{12}$ of the first switch signal $S_5$ falls at a time $t_{53}$ delayed by 2·Td from the time $t_{52}$, so that the second switch signal $S_6$ rises again. Thereafter, the rectangular signal $S_0$ rises at a time $t_{54}$ and thereby the second switch signal $S_6$ falls.

As described above, the changes in the levels of the input signal $S_1$, first switch signal $S_5$ and second switch signal $S_6$, which are synchronized with a change in the level of the rectangular signal $S_0$, are repeated. Eventually, the first switch signal $S_5$ has a signal waveform which rises after the delay time Td has elapsed since the rising edge of the input signal $S_1$ and falls with being advanced by the delay time Td before the falling edge of the input signal $S_1$. On the other hand, the second switch signal $S_6$ has a signal waveform which rises after the delay time Td has elapsed since the falling edge of the input signal $S_1$, and falls with being advanced by the delay time Td before the rising edge of the input signal $S_1$. Incidentally, the input signal $S_1$ and the first switch signal $S_5$ respectively correspond to the input signal $S_1$ and switch signal $S_5$ described in FIG. 1.

Figure 4:
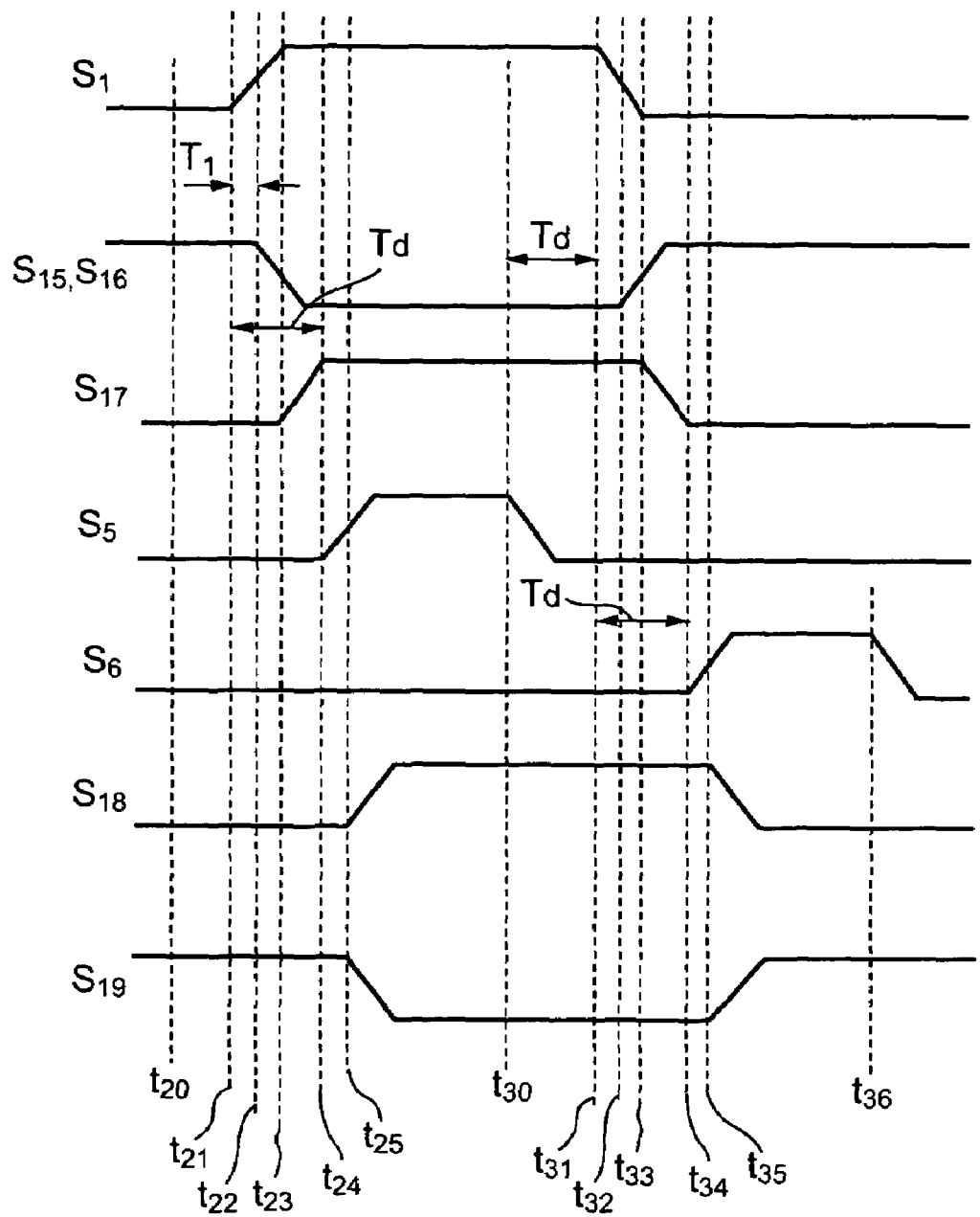
FIG. 4 is a timing chart showing signal waveforms at respective parts of the complementary signal generator 21.

The operation of the complementary signal generator 21 (see FIG. 3) inputted with the input signal $S_1$, first switch signal $S_5$ and second switch signal $S_6$ formed in the above-described manner will be explained below while referring to a timing chart of FIG. 4 illustrating signal waveforms at the respective parts thereof.

Incidentally, for simplicity of explanation, the respective elements have transition times nearly equal upon signal inversion, and the threshold voltage of the input is set to about 50% of a power supply voltage Vc for the complementary signal generator 21.

As shown in the timing chart of FIG. 4, the input signal $S_1$, the first switch signal $S_5$ and the second switch signal $S_6$ are all an "L" level in an initial state at a time $t_{20}$. Further, the analog switches 27, 28, 29 and 30 are in an off state that makes nonconduction between the respective connecting terminals. Since the input signal $S_1$ is of the "L" level, both inverter output signals $S_{15}$ and $S_{16}$ become an "H" level, and an inverter output signal $S_{17}$ becomes an "L" level.

Although the positive-phase output terminal 32 and the antiphase output terminal 33 are both placed in the floating state at this time, they respectively maintain states to be described later, prior to being brought to the floating state, i.e., a state in which a positive-phase output signal $S_{18}$ is "L" in level and a state in which an antiphase output signal $S_{19}$ is "H" in level.

Thereafter, when the input signal $S_1$ rises at a time $t_{21}$, the inverter output signals $S_{15}$ and $S_{16}$ both fall at a time $t_{22}$ after a delay time $T_1$, and the inverter output signal $S_{17}$ rises at a time $t_{23}$ further delayed by the delay time $T_1$ from the time $t_{22}$. The first switch signal $S_5$ rises with being delayed by a predetermined delay time Td from the input signal $S_1$ at a time $t_{24}$ after the inverter output signal $S_{16}$ has reached the "L" level and the inverter output signal $S_{17}$ has reached the "H" level. Accordingly, the N channel type FETs of the analog switches 27 and 28 are simultaneously turned on at a time $t_{25}$ after the delay time $T_1$ has elapsed since the time $t_{24}$. Subsequently, the P channel type FETs thereof are further turned on. At this time, the analog switches 27 and 28 respectively become an on state which makes conduction between their connecting terminals.

Thus, the positive-phase output signal $S_{18}$ and the antiphase output signal $S_{19}$ are respectively simultaneously inverted to "H" and "L" levels with the turning on of the N channel type FETs of the analog switches 27 and 28.

Thereafter, when the switch signal $S_5$ falls at a time $t_{30}$ preceding the falling edge of the input signal $S_1$ at a time $t_{31}$, the analog switches 27 and 28 are both brought to an off state so that the positive-phase output terminal 32 and the antiphase output terminal 33 are respectively brought to a floating state. However, the positive-phase output signal $S_{18}$ and the antiphase output signal $S_{19}$ are respectively maintained in states of "H" and "L" levels.

Then when the input signal $S_1$ falls at the time $t_{31}$, the inverter output signals $S_{15}$ and $S_{16}$ rise together at a time $t_{32}$ after the delay time $T_1$ has elapsed, and the inverter output signal $S_{17}$ falls at a time $t_{33}$ further delayed by the delay time $T_1$ from the time $t_{32}$. The second switch signal $S_6$ rises with being delayed by a predetermined delay time Td from the falling edge of the input signal $S_1$ at a time $t_{34}$ after the inverter output signal $S_{16}$ has reached the "H" level and the inverter output signal $S_{17}$ has reached the "L" level. Accordingly, the N channel type FETs of the analog switches 29 and 30 are simultaneously turned on at a time $t_{35}$ after the delay time $T_1$ has elapsed since the time $t_{34}$. Subsequently, the P channel type FETs thereof are further turned on. At this time, the analog switches 29 and 30 respectively become an on state which makes conduction between their connecting terminals.

Thus, the positive-phase output signal $S_{18}$ and the antiphase output signal $S_{19}$ are respectively simultaneously inverted to "H" and "L" levels with the turning on of the N channel type FETs of the analog switches 29 and 30. Thereafter, when the second switch signal $S_6$ falls at a time $t_{36}$ prior to the rising edge of the input signal $S_1$, the analog switches 29 and 30 are brought to an off state again so that the positive-phase output terminal 32 and the antiphase output terminal 33 are respectively brought to a floating state. However, the positive-phase output signal $S_{18}$ and the antiphase output signal $S_{19}$ are respectively maintained in states prior to being brought to the floating state, i.e., in "L" and "H" level states. The states are equivalent to the state at the time $t_{20}$ referred to above, and subsequently, similar operations are repeated according to the change in the level of the input signal $S_1$.

The above-mentioned complementary signal generator 21 is used as, for example, a switch signal supply circuit of the voltage circuit 71 (see FIG. 7) in place of the complementary signal generator 1 employed in the same drawing. In this case, the positive-phase output signal $S_6$ results in $S_{18}$, and the antiphase output signal $S_7$ results in $S_{19}$.

According to the complementary signal generator showing the embodiment 2, as described above, the inversion timings for both the rising edge of one of the outputted complementary signals and the falling edge of the other thereof or the falling edge of the one thereof and the rising edge of the other thereof can be aligned with each other. Therefore, the complementary signal generator makes possible a circuit operation in which switching timings for switches are always aligned, by using it as a switch selector or changeover signal supply circuit for a circuit for simultaneously switching a plurality of switches by complementary signals, such as shown in FIG. 7 by way of example.

Incidentally, while the aforementioned embodiments have been explained using MOSFETs as switching elements, the present invention is not limited to it. The present invention can take various forms such as a form that elements for allowing currents to flow bidirectionally will suffice.

According to the present invention, the respective inversion timings for at least either of the rising edge of one of outputted complementary signals and the falling edge of the other thereof, or the falling edge of one thereof and the rising edge of the other thereof can be aligned. It is therefore possible to provide a complementary signal generator suitable for use as a switch changeover signal supply means used for a circuit which simultaneously changes over or switches a plurality of switches by complementary signals, for example.

While the preferred form of the present invention has been described, it is to be understood that modifications will be apparent to those skilled in the art without departing from the spirit of the invention. The scope of the invention is to be determined solely by the following claims.

What is claimed is:

1. A complementary signal generator for outputting complementary positive-phase and antiphase signals that vary between a first logical value and a second logical value, comprising:
   a signal forming unit for outputting a positive-phase intermediate signal being in phase with an input signal varying between the first logical value and the second logical value to a positive-phase intermediate node, and an antiphase intermediate signal antiphase to the input signal to an antiphase intermediate node;
   a positive-phase signal output part;
   an antiphase signal output part;
   a first connecting means connected among the positive-phase intermediate node, the antiphase intermediate note, the positive-phase signal output part, and the antiphase signal output part and having a first control terminal for receiving a first control signal produced in synchronism with a state change of the input signal from the first logical value to the second logical value, and for simultaneously transferring the second logical value of the positive-phase intermediate signal and the first logical value of the antiphase intermediate signal to the positive-phase signal output part and the antiphase signal output part respectively; and
   a driving means for individually setting respective states of the positive-phase signal output part and the antiphase signal output part to the first logical value and the second logical value.

2. The complementary signal generator according to claim 1, further comprising a second connecting means connected among the positive-phase intermediate node, the antiphase intermediate node, the positive-phase signal output part, and the antiphase signal output part and having a second control terminal for receiving second control signal produced in synchronism with a stage change of the input signal from the first logical value to the second logical value, and for simultaneously transferring the first logical value of the positive-phase intermediate signal and the second logical value of the antiphase intermediate signal to the positive-phase signal output part and the antiphase signal output part, respectively.

3. The complementary signal generator according to claim 2, wherein each of the first and second connecting means has analog switches that comprise a pair of parallel-connected P channel and N channel type FETs.

4. The complementary signal generator according to claim 2, wherein the second connecting means inhibits the transfer of the logical values of the positive-phase intermediate node and the antiphase intermediate node.

5. The complementary signal generator according to claim 1, wherein the first logical value corresponds to an "L" level, and the second logical value corresponds to an "H" level.

6. The complementary signal generator according to claim 1, wherein the first connecting means inhibits the transfer of the logical values of the positive-phase intermediate node and the antiphase intermediate node.

* * * * *